United States Patent
Suyama et al.

[11] Patent Number: 5,260,903
[45] Date of Patent: Nov. 9, 1993

[54] SEMICONDUCTOR MEMORY DEVICE

[75] Inventors: Junichi Suyama; Yoshihiro Murashima, both of Tokyo, Japan

[73] Assignee: Oki Electric Industry Co., Ltd., Tokyo, Japan

[21] Appl. No.: 834,374

[22] Filed: Feb. 12, 1992

[30] Foreign Application Priority Data

Feb. 19, 1991 [JP] Japan .................................. 3-024736

[51] Int. Cl.⁵ ............................................. G11C 7/00
[52] U.S. Cl. ..................... 365/189.05; 365/230.08; 365/233
[58] Field of Search ................. 365/189.05, 230.08, 365/193, 194, 233

[56] References Cited

U.S. PATENT DOCUMENTS

| | | | |
|---|---|---|---|
| 4,573,147 | 2/1986 | Aoyama et al. | 365/230.08 |
| 4,715,017 | 12/1987 | Iwahashi | 365/189.05 X |
| 4,866,675 | 9/1989 | Kawashima | 365/194 |
| 4,894,803 | 1/1990 | Aizaki | 365/189.05 |
| 5,043,944 | 8/1991 | Nakamura et al. | 365/189.05 |
| 5,051,955 | 9/1991 | Kobayashi | 365/189.02 |

OTHER PUBLICATIONS

Oki Data Book "Memory", 5th Edition issued Feb. 1990.

*Primary Examiner*—Eugene R. LaRoche
*Assistant Examiner*—Son Dinh
*Attorney, Agent, or Firm*—Edward D. Manzo

[57] ABSTRACT

A semiconductor memory device provided that first data is read out from a first memory cell within a first readout period; and second data is read out from the second memory cell within a second readout period; wherein an amplifier circuit receiving the first and second data, outputting first data signals having first electric potential level corresponding to the first and second data and outputting second data signal having second electric potential level; control circuit, in response to an external control signal, generating a first control signal in each of the first and second readout periods, the first control signal indicating first logic level during an enabling period of time within each of the first and second readout periods, otherwise the first control signal indicating second logic level; a first latch circuit latching the first data signals in the respective first and second readout periods and outputting a first latched data signal at the time of the first control signal indicating the first logic level; a second latch circuit latching the second data signals in the respective first and second readout periods and outputting a second latched data signal at the time of the first control signal indicating the first logic level; and a reset circuit placing the first and second latch circuit in an initial status after the first control signal is transferred from the first logic level to the second logic level in the first readout period and before the first control signal is transferred from the second logic level to the first logic level in the second readout period.

12 Claims, 4 Drawing Sheets

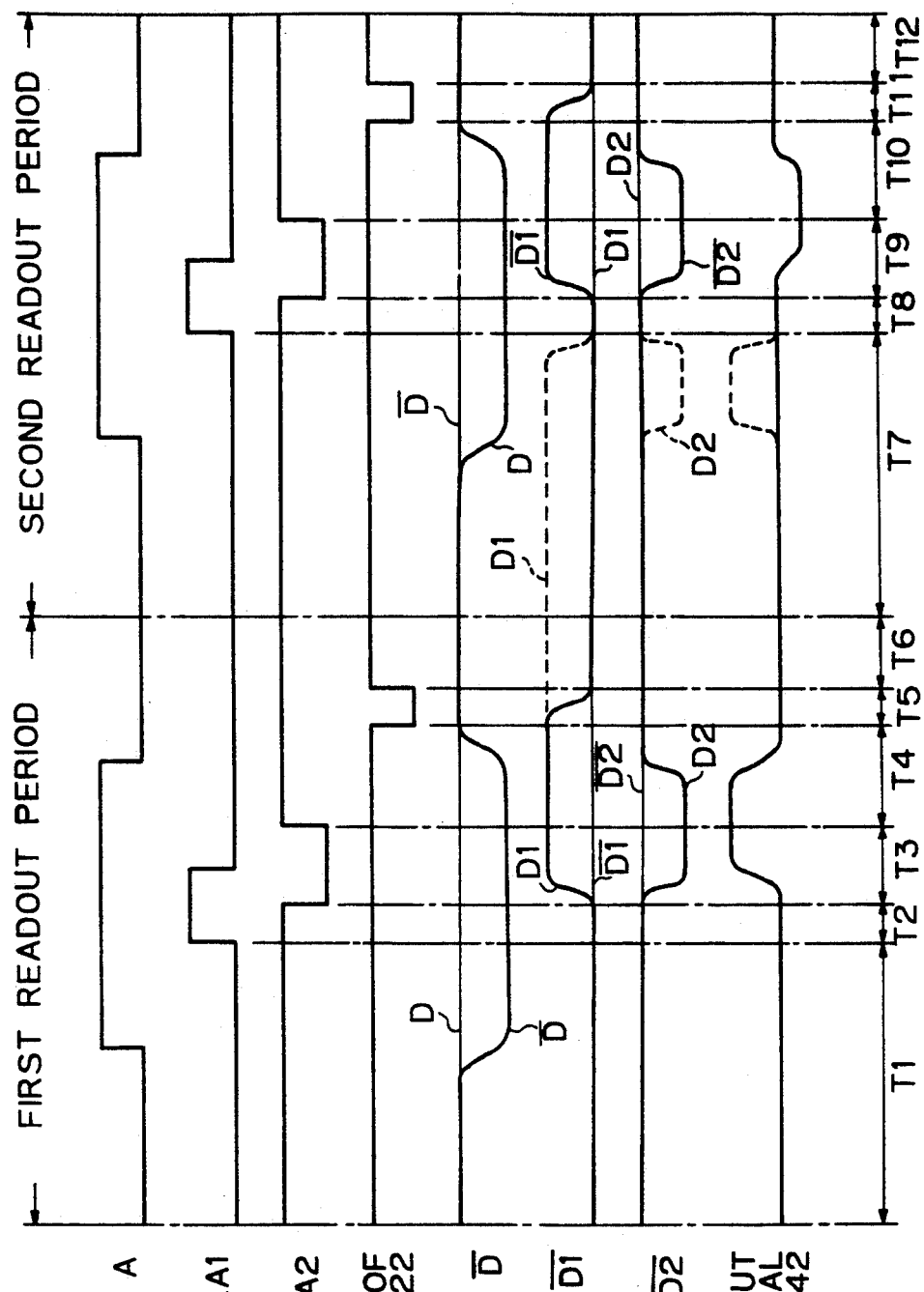

SEMICONDUCTOR MEMORY DEVICE

BACKGROUND OF THE INVENTION

1. FIELD OF THE INVENTION

The present invention relates a to semiconductor memory device, such as a Dynamic Random Access Memory (DRAM), particularly to an output data latch circuit of the semiconductor memory device.

2. DESCRIPTION OF THE RELATED ART

A conventional semiconductor memory device employs a memory cell array having memory cells, respectively storing data therein, and associated peripheral circuits. In the peripheral circuits, there is an output data latch circuit to latch, in response to a latch timing control signal, a certain logic level of a data signal based upon data stored in one of the memory cells and to control, in response to an output timing control signal, a data output circuit so as to output signal having the certain logic level in every readout cycle defined by the external control signal such as $\overline{RAS}$ (Row Address Strobe) and $\overline{CAS}$ (Column Address Strobe) signals. The latch and output timing control signals, applied to the data latch circuit, can respectively be generated in prescribed limited timing by the conventional control signal generator comprised of conventional combination of logic circuits in response to the external control signal.

SUMMARY OF THE INVENTION

It is an object of the present invention to provide a semiconductor memory device employing an improved data latch circuit.

It is also an object of the present invention to provide a semiconductor memory device employing a data latch circuit which can correctly perform the readout operation regardless of certain variation of the control signal generation timing.

A semiconductor memory device according to the present invention is provided with a first memory cell storing first data therein, the first data being read out from the first memory cell within a first readout period of time; a second memory cell storing second data therein, the second data being read out from the second memory cell within a second readout period of time following the first readout period of time; an amplifier circuit receiving the first and second data from the first and second memory cells in the respective first and second readout periods, outputting first data signals having either first or second electric potential levels corresponding to the first and second data and outputting second data signal having either the second or first electric potential levels opposite to that of the respective first data signals; control circuit, in response to an external control signal, generating a first control signal in each of the first and second readout periods, the first control signal indicating first logic level during an enabling period of time within each of the first and second readout periods, otherwise the first control signal indicating second logic level within each of the first and second readout periods; a first latch circuit for latching the logic level of the first data signals from the amplifier in the respective first and second readout periods and outputting a first latched data signal at the time of the first control signal indicating the first logic level; a second latch circuit latching the logic level of the second data signals from the amplifier in the respective first and second readout periods and outputting a second latched data signal at the time of the first control signal indicating the first logic level; and a reset circuit placing the first and second latch circuit in an initial status after the first control signal is transferred from the first logic level to the second logic level in the first readout period and before the first control signal is transferred from the second logic level to the first logic level in the second readout period.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIGS. 4A–4I are timing charts of control signals and data signals to explain the readout operation of the FIG. 2 circuit.

DESCRIPTION OF THE PREFERRED EMBODIMENT

Figure 1:
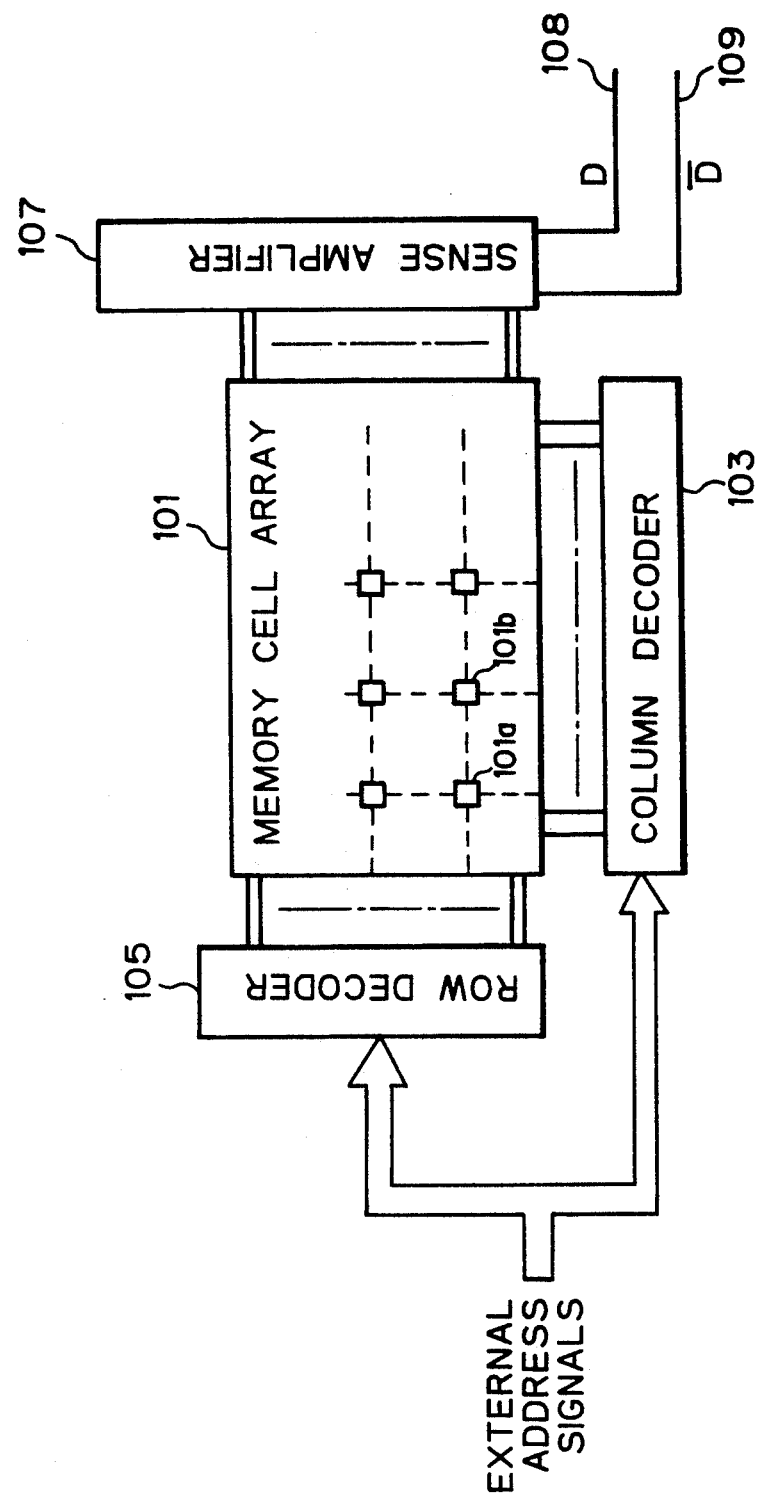
FIG. 1 is a block diagram of a conventional memory cell array 101 and some of associated peripheral circuits.

A memory cell array 101 and associated peripheral circuit of a conventional semiconductor memory device are shown in FIG. 1. The memory cell array 101 employs a plurality of memory cells, respectively storing data therein such as memory cells 101a and 101b arranged in the matrix form. In every read cycle defined by the external control signals such as $\overline{RAS}$ (Row Address Strobe) and $\overline{CAS}$ (Column Address Strobe) signals, one of memory cells in the memory cell array 101 is selected by row and column decoders 103 and 105 in response to external address signals. The selected memory cell applies a certain electric potential, according to the data stored therein, to a sense amplifier circuit 107. The sense amplifier circuit 107 compares the applied electric potential from the selected memory cell with a reference electric potential and amplifies the electric potential difference between the applied and reference electric potential. As the result of the comparison, the sense amplifier circuit 107 outputs a first data signal D having either a high or low electric potential and a second data signal $\overline{D}$ having a potential 'opposite' (in logic value) to that of the first data signal. The foregoing circuits are well known in the art, for example, employed in a 4 mega-bit dynamic RAM MSM514100 manufactured by OKI Electric Industry Co., Ltd. and explained in MEMORY DATA BOOK 1990/1991, page 220–233, issued on February, 1990, of which the entire disclosure is incorporated herein by reference. In this dynamic RAM, the high electric potential of first and second data signal is substantially a supply voltage Vcc (5 V) while the low electric potential is substantially Ground (0 V). The reference electric potential is substantially one half of the supply voltage level.

Turning now to the embodiment of the present invention hereunder, we assume for ease of explanation that according to the external address signals, the memory cell 101a storing logic ONE level data is selected in a first readout period of time and, thereafter, the memory cell 101b storing logic ZERO level data is selected in a second readout period of time following the first readout period of time.

At the beginning (period of T1 in FIG. 4I) the first readout period of time, the sense amplifier circuit 107 of FIG. 1 outputs a first data signal D having a high electric potential (Vcc) through a first data line 108 and a second data signal $\overline{D}$ having a low electric potential (ground) through a second data line 109 because of the memory cell 101a storing the logic ONE level as shown in FIG. 4E.

Figure 2:
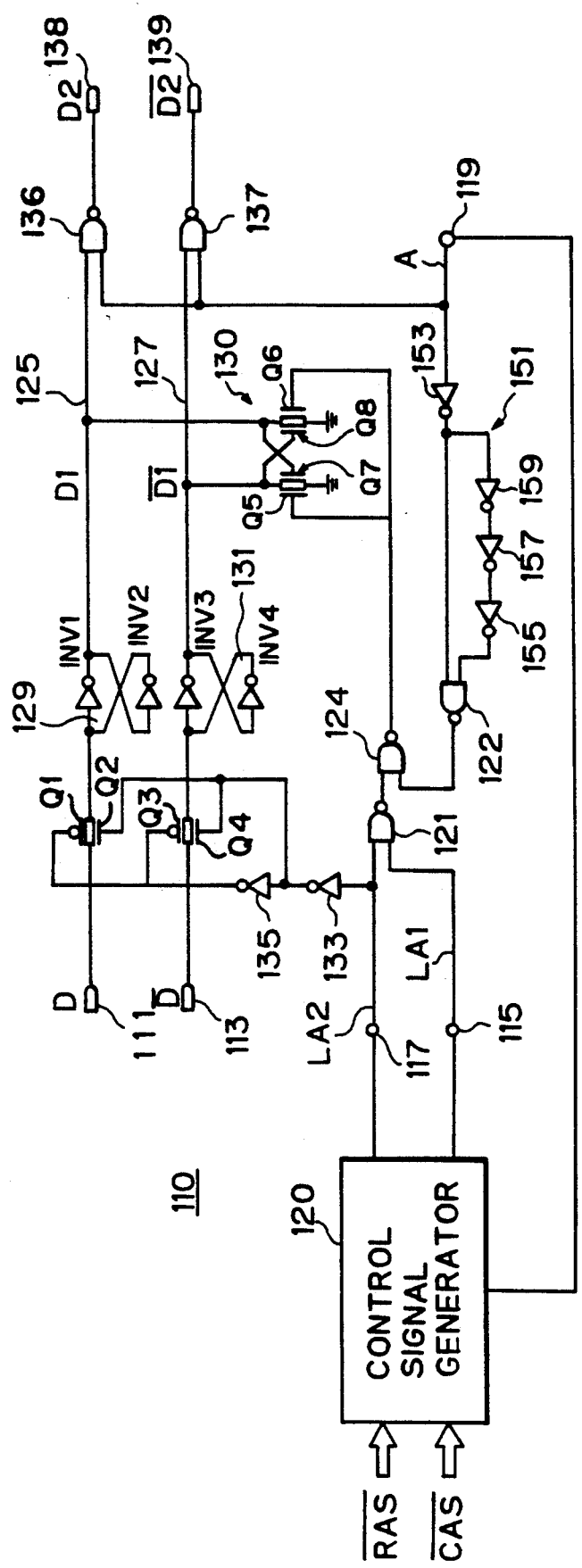
FIG. 2 is a circuit diagram of a data latch circuit 110 in accordance with the preferred embodiment of the present invention.

A data latch circuit 110 as shown in FIG. 2 has first and second input terminals 111 and 113 respectively to receive a pair of the first and second data signals D and $\overline{D}$ through the respective first and second data lines 108 and 109. The data latch circuit also receives a first data latch signal LA1 at a terminal 115 thereof, a second data latch signal LA2 at a terminal 117 thereof and an activation signal A at a terminal 119 thereof. The first and second data latch signals LA1 and LA2 and activation signal A can be generated by a conventional control signal generator 120 employing a conventional combination of logic circuits in response to $\overline{RAS}$ and $\overline{CAS}$ signals. The activation signal A control the output of the data latch circuit 110 and is synchronized with $\overline{RAS}$ or $\overline{CAS}$ signals. The logic level of activation signal A is changed from a low (second) logic level to a high (first) logic level and then changed from the high logic level to the low logic level in every readout period of time as shown in FIG. 4A. The first data latch signal LA1 can be considered as a high level one shot pulse generated in every readout period of time to reset the data latch circuit 110 as shown in FIG. 4B. The second data latch signal LA2 can be considered as a low level one shot pulse generated in every readout period of time to provide with the data latch circuit the timing to latch the first and second data signals D and $\overline{D}$ after the data latch circuit is reset in response to the first data latch signal LA1 as shown in FIG. 4C.

During time T2 in the first readout period of time, as shown in FIGS. 4B and 4C, a NAND circuit 121 receives the first data latch signal LA1 having the high logic level changed from the low logic level at one input terminal thereof and the second data latch signal LA2 having the high logic level at the other input terminal thereof, thus the output of NAND circuit 121 is changed from the high logic level to the low logic level. Therefore an output of a NAND circuit 124, receiving the output of the NAND circuit 121 at one input terminal thereof and a reset control signal having the high logic level at the other input terminal thereof, is changed to the high logic level and both of n-channel type MOS transistors Q5 and Q6 of a reset circuit 130, receiving the output of the NAND circuit 124 at the gate electrodes thereof, are turned on. Consequently, as shown in FIG. 4F a pair of third and fourth data lines D1 and $\overline{D1}$ are maintained at the low logic level (Ground level) during at least the period of T2 even if the third and second data line had stored electric changes therein due to electric noises generated at the previous period and, further, both of a first Flip-Flop circuit 129 comprised of two invertor circuit INV1 and INV2 and a second Flip-Flop circuit 131 comprised of two invertor INV3 and INV4 are respectively reset so as to output the low logic level.

At period T3, as shown in FIGS. 4B and 4C, as the first data latch signal LA1 is maintained at the high logic level and the second data latch signal LA2 is changed to the low logic level, MOS transistor Q1, Q2, Q3 and Q4 are turned ON at the same time, while the MOS transistors Q5 and Q6 are turned OFF. Because the gate electrodes of p-channel type MOS transistors Q1 and Q3 respectively receive the second data latch signal LA2 through two inverters 133 and 135, the gate electrodes of n-channel type MOS transistors Q2 and Q4 respectively receive the second data latch signal LA2 through the invertor 133 while the gate electrodes of n-channel type MOS transistors Q5 and Q6 in the reset circuit 130 respectively receive the low level output signals from the NAND circuit 124 in response to the second data latch signal LA2. With to the MOS transistors Q1, Q2, Q3 and Q4 being in the ON state, the first Flip-Flop circuit 129 latches the high logic level corresponding to the high electric potential of the first data signal D and outputs a third data signal D1 having the high logic level to the third data line 125, while the second Flip-Flop circuit 131 latches the low logic level corresponding to the low electric potential of the second data signal $\overline{D}$ and outputs a fourth data signal $\overline{D1}$ having the low logic level to the fourth data line 127 as shown in FIG. 4F. In order to maintain the logic level of the respective third and fourth data lines 125, 127, the reset circuit 130 further has n-channel type transistors Q7 and Q8. The transistor Q7 has a source electrode connected to Ground, a drain electrode connected to the fourth data line 127 and a gate electrode connected to the third data line 125. Transistor Q8 has a source electrode connected to Ground, a drain electrode connected to the third data line 125 and a gate electrode connected to the fourth data line 127. Thus, the transistor Q7 is in the ON status, while the transistor Q8 is in the OFF status since the third data signal D1 is in the high logic level and the fourth data signal $\overline{D1}$ is in the low logic level. Thus it will be appreciated that transistors Q7 and Q8 pull down the voltage of a selected line 125 or 127: where line 125 is high, line 127 is pulled low, and vice versa.

In period T3, a NAND circuit 136 in FIG. 2 receives the third data signal D1 having the high logic level at one terminal thereof, connected with the third data line 125 and the activation signal A having the high logic level at the other terminal thereof, connected with the terminal 119, thus outputs a fifth data signal D2 having the low logic level to an output terminal 133. At the same time, a NAND circuit 137 in FIG. 2 receives the fourth data signal $\overline{D1}$ having the low logic level at one terminal thereof, connected with the fourth data line 127 and the activation signal A having the high logic level at the other terminal thereof, connected with the terminal 119, thus outputs a sixth data signal $\overline{D2}$ having the high logic level to an output terminal 135. This can be to say that the data latch circuit 110 may output from the respective output terminals 133 and 135 thereof the respective fifth and sixth data signals D2 and $\overline{D2}$ having the opposite logic level to the respective third and fourth data signals D1 and $\overline{D1}$, provided that the activation signal A is the high logic level. In case of the activation signal A being the low logic level, the data latch circuit 110 outputs the fifth and sixth data signals D2 and $\overline{D2}$ respectively having the high logic level regardless of the logic level of the third and fourth data signals D1 and $\overline{D1}$. Therefore, as shown in FIG. 4G, the NAND circuit 136 and 137 in the data latch circuit 110 respectively output the fifth data signal $\overline{D2}$ having the low logic level and the sixth data signal $\overline{\overline{D2}}$ having the high logic level during the period T3 and the beginning of a period T4 i.e. until the activation signal A is changed to the low logic level.

The data latch circuit 110, further, employs a delay circuit 151. The delay circuit 151 has a NAND circuit 122 one input terminal of which is connected to the terminal 119 through an inverter 153. Another input terminal of logic circuit 122 connected to the output terminal of the inverter 153 through three inverters 155, 157 and 159. The delay circuit 151 detects that the activation signal A has been changed from the high logic level to the low logic level and outputs, in response to the result of the detection, a low level one shot pulse during a prescribed period of time set by the inverters. The delay circuit 122 operates as follows:

First, during the activation signal having the high logic level being generated, since the NAND circuit 122 receives the low level signal outputted from the output terminal of the inverter 153 at one terminal thereof and the high level signal outputted from the output terminal of the inverter 155, the NAND circuit 122 outputs the high level signal. Second, at the time of the activation signal having been changed from the high level to the second level, since the NAND circuit receives the high level signal from the output terminal of the inverter 153 at one terminal thereof and the low level signal changed from the high level signal after the prescribed period of time, corresponding to the delay time due to the inverters 155, 157 and 159, after the inverter 153 outputs the high level signal, the NAND circuit 122 outputs the low level signal during the prescribed period of time T5, as shown in FIG. 4D, and, then, outputs the high level output signal.

In the period of time T5, since the NAND circuit 124 receives the low level signal outputted from the NAND circuit 122 at one terminal thereof and the high level signal outputted from the NAND circuit 121 at the other terminal thereof, the NAND circuit 124 outputs the high level signal to the gate of the negative channel type MOS transistors Q5 and Q6 in the reset circuit 130. Thereby, the second pair of the third and fourth data lines 125 and 127 are reset to the low level (Ground) and the first and second Flip-Flop 129 and 131 are also reset so as to respectively output the respective third and fourth data signal D1 and $\overline{D1}$ each having the low logic level as shown in FIG. 4F. By the way, the number of the inverters 155, 157 and 159 in the delay circuit 151 can be varied as long as the number of the inverters is odd and should be selected so as to provide the low level signals with the NAND circuit 124 during a sufficient period of time to reset both of the Flip-Flop circuits 129 and 131.

In the period of time T6 after T5, all of the signals applied to the data latch circuit 110 are back to the initial status of the first readout period of time, as shown in FIGS. 4A-4G. Then, the first readout period of time is ceased and the second readout period of time will be successively begun in response to the external control signals.

At the beginning (period T7 in FIG. 4I) of the second readout period of time following the first readout period of time, the sense amplifier circuit 107 outputs another first data signal D having a low electric potential (Ground) through first date line 108 and a second data signal D having a high electric potential (Vcc) through second data line 109 because of the second memory cell 101b storing the logic ZERO level.

The date latch circuit 110 receives these first and second data signals at its inputs 111 and 113. As before, it receives the first and second latch signals LA1, LA2 and the activation signal A, as shown in FIGS. 4B, 4C and 4A respectively. The first data latch signal LA1 is used to reset the date latch circuit 110. The second data latch signal LA2 provides the timing to latch the first and second data signals D and $\overline{D}$ after the data latch circuit is reset in response to the first data latch signal LA1 as shown in FIGS. 4B and 4C.

At the period T8 in the second readout period of time, as shown in FIGS. 4B and 4C, NAND circuit 121 receives the first data latch signal LA1 having the high logic level changed from the low logic level at one input terminal thereof and the second data latch signal LA2 having the high logic level at the other input terminal thereof, thus the output of NAND circuit 121 is changed from the high logic level to the low logic level. Therefore an output of NAND circuit 124, receiving the output of the NAND circuit 121 at one input terminal thereof and a reset control signal having the high logic level at the other input terminal thereof, is changed to the high logic level and both transistors Q5 and Q6 of reset circuit 130, turn ON. Consequently, as shown in FIG. 4F third and fourth data lines D1 and $\overline{D1}$ are maintained at the low logic level (Ground level) throughout period T8 even if the third and second data line had stored electric charges therein due to electric noises generated at the previous period. Flip-Flops 129 and 130 are respectively reset so as to output the low logic level.

At the period T9, as shown in FIGS. 4B and 4C, as the first data latch signal LA1 is maintained at the high logic level and the second data latch signal LA2 is changed to the low logic level, MOS transistors Q1, Q2, Q3 and Q4 are turned ON at the same time, while the MOS transistors Q5 and Q6 are turned OFF. Since transistors Q1, Q2, Q3 and Q4 are conductive, the first Flip-Flop circuit 129 latches the low logic level corresponding to the low electric potential of the first data signal D and outputs a third data signal D1 having the low logic level to the third data line 125, while the second Flip-Flop circuit 131 latches the high logic level corresponding to the high electric potential of the second data signal $\overline{D}$ and outputs a fourth data signal $\overline{D1}$ having the high logic level to the fourth data line 127 as shown in FIG. 4F. In order to maintain the logic level of the respective third and fourth data line 125, 127, the transistor Q7 of the reset circuit 130 remains relatively non-conductive since its gate electrode receives the low voltage representing D1. However, transistor Q8 turns ON since the fourth data signal $\overline{D1}$ is in the high logic level and is applied to the gate electrode of transistor Q8.

In period T9, NAND circuit 136 in FIG. 2 receives the third data signal D1 having the low logic level via the third data line 125, and receives the activation signal A having the high logic level at the other terminal thereof, connected with the terminal 119, thus outputs a fifth data signal $\overline{D2}$ having the high logic level to an output terminal 138. At the same time, a NAND circuit 137 in FIG. 2 receives the fourth data signal $\overline{D1}$ having the high logic level at one terminal thereof, connected with the fourth data line 127 and the activation signal A having the high logic level at the other terminal thereof, connected with the terminal 119, thus outputs a sixth data signal $\overline{D2}$ having the low logic level to an output terminal 139. As shown in FIG. 4G, the NAND circuits 136 and 137 in the data latch circuit 110 respectively continue to output the fifth data signal D2 having the high logic level and the sixth data signal $\overline{D2}$ having the low logic level during the period T9 and the beginning of a period T10 i.e. until the activation signal A is changed to the low logic level.

In time period T11, one terminal of NAND circuit 124 receives the low level signal outputted from the NAND circuit 122, according to the detection of the activation signal A being changed from the high to the low logic level by means of the delay circuit 151. High level signal is applied from the NAND circuit 121 to the other terminal of NAND circuit 124, which accordingly outputs a high level signal to the gate electrode of the n-channel type MOS transistors Q5 and Q6 in the reset circuit 130. When these transistors turn on, third and fourth data lines 125 and 127 are reset (clamped) to the low level (Ground) and the first and second Flip-Flops 129 and 131 are also reset so as to respectively output the respective third and fourth data signals D1 and $\overline{D1}$ each having the low logic level, as shown in FIG. 4F. It will be appreciated that when line 125 is pulled low by the source-drain path of transistor Q6, that low voltage is applied to the input of inverter INV2, driving its output high. This in turn is applied to the input of inverter INV1, which then outputs a low voltage. The low voltage on line 127, clamped by transistor Q5, has the same effect on inverters INV3 and INV4 in flip-flop 131. In the period of time T12 after T11, all of the signals, applied to the data latch circuit 110, are returned to the initial status of the second readout period of time, as shown in FIGS. 4A-4G.

Figure 3:
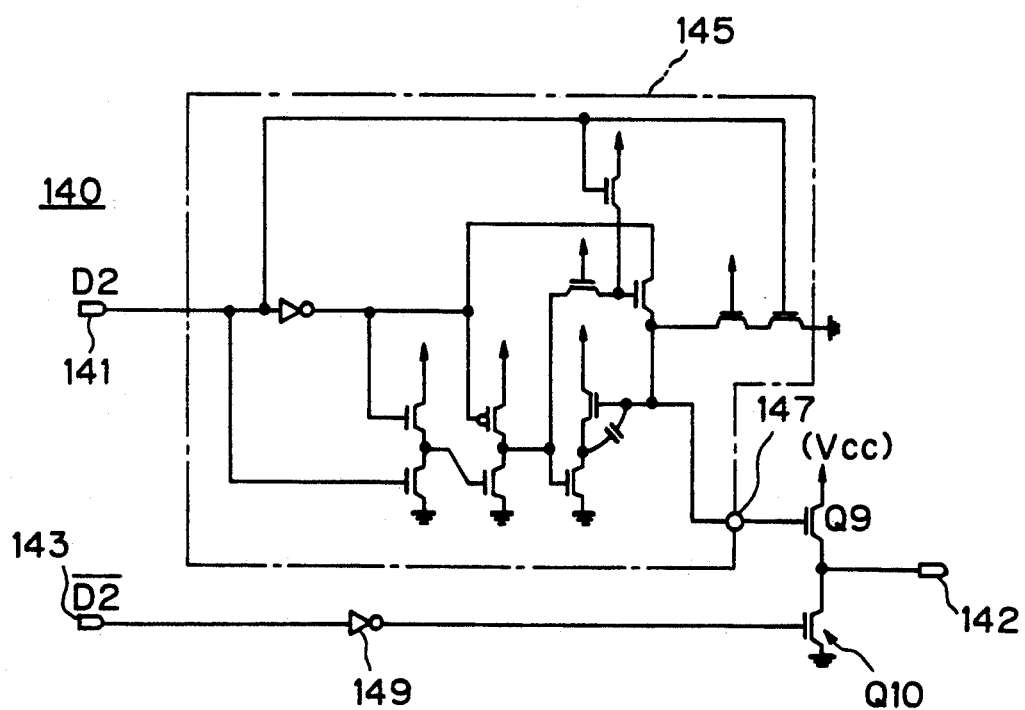
FIG. 3 is a circuit diagram of a conventional data output circuit controlled by the data latch circuit 110 shown in FIG. 2.

A data output from a conventional data output circuit 140 shown in FIG. 3 is provided in response to the fifth and sixth data signals D2 and $\overline{D2}$ in every readout cycle. The data output circuit 140, shown in FIG. 3, receives the fifth data signal D2 from the output terminal 138 at a terminal 141 and the sixth data signal $\overline{D2}$ from the output terminal 139 at a terminal 143. In case of both of the fifth and sixth data signals D2, $\overline{D2}$ being in the high logic level i.e. in the periods of T1, T2, T5, T6, T7, T8, T11 and T12, both n-channel type MOS transistors Q9 and Q10 are OFF and, then, the output terminal 142 is clamped at certain electric potential level such as 1.32 volts by means of a conventional clamp circuit (not shown) so as to avoid placing the output terminal 142 in the floating condition.

In case of the fifth data signal D2 being in the low logic level and the sixth data signal $\overline{D2}$ being in the high logic level, i.e. the first memory cell 101a storing the logic ONE level therein, a conventional bootstrap circuit 145 applies a (boosted) voltage (Vcc+Vth) higher than the supply voltage Vcc to the gate electrode of the transistor Q9. Therefore, in the periods of T3 and T4, since the transistor Q9 is fully placed in the ON status so as to apply a maximum value equal to the supply voltage Vcc to the output terminal 142, while the transistor Q10, of which gate electrode receive the sixth data signal D2 through an inverter 149, is placed in the OFF status, the output terminal 142 outputs the high level signal substantially equal to the supply voltage level Vcc in the periods of T3 and T4 of the first readout period of time as shown in FIG. 4H.

In case of the fifth data signal D2 being in the high logic level and the sixth data signal $\overline{D2}$ being in the low logic level, i.e. the second memory cell 101b storing the logic ZERO level therein, a conventional bootstrap circuit 145 does not work and applies the low level signal (Ground) to the gate electrode of the transistor Q9 so as to place the transistor Q9 in the OFF status. While the transistor Q10, of which gate electrode receives the sixth data signal $\overline{D2}$ through an inverter 149, is placed in the ON status, the output terminal 142 outputs the low level signal substantially equal to Ground in the periods of T9 and T10 of the second readout period of time, as shown in FIG. 4H.

There has been explained the operation of the first and second readout periods of time in the readout cycle of the DRAM, but in another readout period of time following the first or second readout periods, the data stored in another memory cell may be successively or intermittently read out therefrom according to the similar operation as mentioned above.

As mentioned above, according to the invention, since both the first and second Flip-Flop circuits 129 and 131 are reset so as to respectively output the initial logic level signals, such as the low logic level signals, by means of the delay circuit 151 and the reset circuit 130 prior to the activation signal A being changed from the low logic level to the high logic level in the second readout period of time, preferably within the first read cycle, the output data, read out in the first readout period will be never read out again in the second readout periods regardless of the activation signal A being changed to the high logic level in the second readout time.

In order to explain the aspect of the present invention assuming that no delay circuit 151 is employed in the data latch circuit 110, the first and second Flip-Flop circuits 129 and 131 respectively output the third and fourth data signals D1 and $\overline{D1}$, latched in the first readout period of time, until the period of T8 as indicated by a broken line in FIG. 4F. Thus, according to the activation signal A being changed to the high logic level in the period of T7 of the second period of time, the fifth data signal $\overline{D2}$ having the low logic level and the sixth data signal $\overline{D2}$ having the high logic are unnecessarily outputted from the data latch circuit 110 as indicated by a broken line in FIG. 4G, and, consequently, the data output circuit 140 outputs a high level signal from the output terminal 142 thereof as indicated by a broken line in FIG. 4H in the period of T7. The unnecessary outputs from the data latch circuit 110 cause undesirable power and time consumption to the data output circuit 140 and, consequently, voltage and signal noises to the semiconductor memory device. Assuming the second memory cell 101b stores the logic ONE level therein instead of the logic ZERO level, the bootstrap circuit 145 might not generate a sufficiently boosted voltage at the period of T9 and T10 and, consequently, the output terminal 142 outputs the high level signal below the supply voltage level Vcc during the period of T9 and T10 because of the short interval (between T7 and T9) of the operation of the bootstrap circuit 145. There is another way other than the application of the present invention to avoid such demerits. That is to control the activation signal so as to be changed to the high logic level within the period of T8, but this calls for great precision in the control of the activation signal. Contrary to this, the memory device according to the present invention does not have to control the activation signal A so as to be changed within the period of T8 as long as the control signal A is changed the high logic level within the period of from T7 to T8. Therefore, the circuity can be more easily designed and operate will greater tolerance in the timing of control signal A.

While the invention has been particularly shown and described above with reference to preferred embodiment thereof, it will be understood by those skilled in the art that various changes in form and details may be made without departing from the spirit and scope of the invention.

For example, in the embodiment discussed above, the high logic level is corresponding to the supply voltage level (Vcc=5 V) and the low logic level is corresponding to the ground level (Vss=0 V), but the high and low logic level may be respectively corresponding to other voltage levels as long as the readout operation can be effectively performed.

What is claimed is:

1. A semiconductor memory device responsive to an external control signal, comprising:
   a first memory cell storing first data therein, said first data being read out from said first memory cell within a first readout period of time;
   a second memory cell storing second data therein, said second data being read out from said second memory cell within a second readout period of time following the first readout period of time;
   an amplifier circuit receiving said first and second data from said first and second memory cells in said respective first and second readout periods, outputting first data signals having either first or second electric potential levels corresponding to said first and second data and outputting second data signal having either the second or first electric potential levels opposite to said respective first data signals;
   control circuit, in response to the external control signal, generating a first control signal in each of said first and second readout periods, the first control signal indicating first logic level during an enabling period of time within each of said first and second readout periods, otherwise the first control signal indicating second logic level within each of said first and second readout periods;
   a first latch circuit latching the logic level of said first data signals from said amplifier in said respective first and second readout periods and outputting a first latched data signal at the time of the first control signal indicating the first logic level;
   a second latch circuit latching the logic level of said second data signals from said amplifier in said respective first and second readout periods and outputting a second latched data signal at the time of the first control signal indicating the first logic level; and
   a reset circuit placing said first and second latch circuit in an initial status after the first control signal is transferred from the first logic level to the second level and before the first control signal is transferred from the second logic level to the first logic level.

2. The device according to claim 1, further comprising the delay circuit for generating a delay signal at a predetermined time after the first control signal is transferred from the first logic level to the second level, wherein said reset circuit resets said first and second latch circuits in response to the delay signal.

3. The device according to claim 1, wherein said control circuit generates a second control signal before the first control signal is transferred from the first level to the second level within each of the first and second readout periods; and wherein said first and second latch circuit respectively latch the respective logic levels of said first and second data signals.

4. The device according to claim 3, further comprising the delay circuit for generating a delay signal at a predetermined time after the first control signal is transferred from the first logic level to the second level, wherein said reset circuit resets said first and second latch circuits in response to the delay signal.

5. A semiconductor device responsive to an external control signal, comprising:
   a first memory cell storing first data therein, said first data being read out from said first memory cell within a first readout period of time;
   a second memory cell storing second data therein, said second data being read out from said second memory cell within a second readout period of time following the first readout period of time;
   an amplifier circuit receiving said first and second data from said first and second memory cells in said respective first and second readout periods and outputting data signals having either first or second logic level corresponding to said first and second data;
   a control circuit, in response to the external control signal, for generating a first control signal in each of said first and second readout periods, the first control signal indicating first logic level during an enabling period of time within each of said first and second readout periods, otherwise the first control signal indicating second logic level within each of said first and second readout periods;
   a latch circuit latching the logic level of said data signals from said amplifier in said respective first and second readout periods and outputting a latched data signal at the time of the first control signal indicating the first logic level; and
   a reset circuit placing said latch circuit in an initial status after the first control signal is changed from the first logic level to the second level and before the first control signal is changed from the second logic level to the first logic level.

6. The device according to claim 5, further comprising the delay circuit generating a delay signal at a predetermined time after the first control signal is changed from the first logic level to the second level, wherein said reset circuit resets said latch circuit in response to the delay signal.

7. The device according to claim 5, wherein said control circuit generates a second control signal before the first control signal is changed from the first level to the second level within each of the first and second readout periods; and wherein said latch circuit latches the logic levels of said data signals.

8. The device according to claim 7, further comprising the delay circuit generating a delay signal at a predetermined time after the first control signal is changed from the first logic level to the second level, wherein said reset circuit resets said latch circuit in response to the delay signal.

9. A method of latching data from a semiconductor memory comprising the steps of:
   applying complementary data from a sense amplifier to first and second latches in circuit with first and second data paths from a pair of inputs to a pair of output logic devices;

providing address strobe signals and an activation signal having first and second states;

when the activation signal is in its first state, driving both of said output logic devices to a first logic level regardless of the state of the complementary data;

following a transition of the activation signal from its first state to its second state, clamping both of the data paths to a reference voltage and releasing said output logic devices;

generating latch control signals from said strobe signals, operating said first and second latches in accordance therewith, releasing the clamping of the first and second data paths so that the first and second latches couple complementary data to inputs of the output logic devices in accordance with the data from the sense amplifier, and driving the output logic devices to provide complementary output data; and prior to the next transition of the activation signal from the first state to the second state, resetting the first and second latches so they both output the same logic signal.

10. The method of claim 9 wherein said step of clamping the data paths includes generating a delayed signal based on the transition of the activation signal and generating a clamp signal based on the delayed signal.

11. The method of claim 10 wherein said generating a clamp signal includes logically combining a control signal with the delayed signal.

12. The method of claim 9 wherein said step of clamping comprises operating a clamp circuit coupled to the first and second data paths.

* * * * *